(12) United States Patent
Jain et al.

(10) Patent No.: US 8,609,300 B2
(45) Date of Patent: Dec. 17, 2013

(54) METHOD OF MAKING HOLOGRAPHIC RECORDING MATERIALS AND ARTICLES FORMED THEREBY

(75) Inventors: Sumeet Jain, Albany, NY (US); Michael T. Takemori, Rexford, NY (US); Mark A. Cheverton, Mechanicville, NY (US); Vicki H. Watkins, Alplaus, NY (US); Andrew A. Burns, Niskayuna, NY (US); Moitreyee Sinha, New York, NY (US); Matthew Frank Niemeyer, North Chatham, NY (US)

(73) Assignee: Sabic Innovative Plastics IP B.V. (NL)

( * ) Notice: Subject to any disclaimer, the term of this patent is extended or adjusted under 35 U.S.C. 154(b) by 15 days.

(21) Appl. No.: 12/985,474

(22) Filed: Jan. 6, 2011

(65) Prior Publication Data

US 2012/0178019 A1 Jul. 12, 2012

Related U.S. Application Data

(63) Continuation-in-part of application No. 12/491,357, filed on Jun. 25, 2009, now abandoned.

(51) Int. Cl.
*G03H 1/02* (2006.01)
(52) U.S. Cl.
USPC ........................................ 430/1; 430/2; 359/3
(58) Field of Classification Search
None
See application file for complete search history.

(56) References Cited

U.S. PATENT DOCUMENTS

| | | | | |
|---|---|---|---|---|
| 4,304,809 A | * | 12/1981 | Moraw et al. | 428/195.1 |
| 4,477,521 A | * | 10/1984 | Lehmann et al. | 428/336 |
| 4,547,002 A | * | 10/1985 | Colgate, Jr. | 283/91 |
| 4,877,717 A | * | 10/1989 | Suzuki et al. | 430/321 |
| 5,192,644 A | * | 3/1993 | Ohta et al. | 430/338 |
| 5,492,370 A | * | 2/1996 | Chatwin et al. | 283/110 |
| 5,716,695 A | * | 2/1998 | Benoit et al. | 428/195.1 |
| 6,103,161 A | * | 8/2000 | Lopez | 264/148 |
| 6,294,267 B1 | * | 9/2001 | Benoit | 428/515 |

(Continued)

FOREIGN PATENT DOCUMENTS

| | | | |
|---|---|---|---|
| CA | 2635037 A1 | | 10/2008 |
| JP | 04-358145 | * | 12/1992 |

(Continued)

OTHER PUBLICATIONS

Popov et al. "Photochemical and diffusional apodization of high-efficiency thick phase holograms", Proc. SPIE vol. 2215 pp. 64-71 (1994).*

(Continued)

*Primary Examiner* — Martin Angebranndt
(74) *Attorney, Agent, or Firm* — Cantor Colburn LLP

(57) ABSTRACT

A method of manufacturing an article for display of a holographic image is described that includes thermally fusing a holographic recording medium containing a photochemically active dye dispersed in a transparent thermoplastic polymer binder to another layer or material; and then exposing the holographic film to intersecting beams of coherent light to form a holographic image therein formed by photoreacted areas of the photochemically active dye and unreacted areas of the photochemically active dye.

10 Claims, 5 Drawing Sheets

(56) References Cited

U.S. PATENT DOCUMENTS

| | | |
|---|---|---|
| 7,102,802 B1 | 9/2006 | Erben et al. |
| 7,524,589 B2 * | 4/2009 | Furuki et al. ............... 430/1 |
| 7,745,065 B2 | 6/2010 | Eto et al. |
| 2001/0015897 A1 | 8/2001 | Aida et al. |
| 2002/0018430 A1 * | 2/2002 | Heckenkamp et al. .. 369/109.01 |
| 2004/0033423 A1 * | 2/2004 | Burzynski et al. ............. 430/2 |
| 2004/0045204 A1 | 3/2004 | Miano et al. |
| 2004/0175656 A1 * | 9/2004 | Baer et al. ............... 430/290 |
| 2004/0190093 A1 * | 9/2004 | Matsui et al. ............... 359/3 |
| 2004/0214106 A1 * | 10/2004 | Berneth et al. ......... 430/270.14 |
| 2004/0264358 A1 | 12/2004 | El Hafidi et al. |
| 2005/0208256 A1 * | 9/2005 | Yoshizawa et al. .......... 428/64.4 |
| 2006/0073392 A1 * | 4/2006 | Erben et al. ............... 430/1 |
| 2006/0109531 A1 | 5/2006 | Watanabe et al. |
| 2006/0221422 A1 | 10/2006 | Mizushima et al. |
| 2007/0018001 A1 * | 1/2007 | Yesildag et al. ............. 235/487 |
| 2007/0064195 A1 * | 3/2007 | Destro et al. ............... 351/63 |
| 2007/0115790 A1 * | 5/2007 | Kawano et al. ............. 369/103 |
| 2007/0147214 A1 | 6/2007 | Erben et al. |
| 2007/0178295 A1 | 8/2007 | Haas et al. |
| 2007/0206249 A1 * | 9/2007 | Phillips et al. .............. 359/2 |
| 2010/0328741 A1 * | 12/2010 | Cheverton et al. ............ 359/2 |

FOREIGN PATENT DOCUMENTS

| | | | |
|---|---|---|---|
| JP | 6220048 A | | 9/1994 |
| JP | 07-077774 | * | 3/1995 |
| JP | 2004-354712 | * | 12/2004 |
| JP | 2005195952 | | 7/2005 |
| JP | 2008281661 | | 11/2008 |
| WO | WO2007050354 A2 | | 5/2007 |
| WO | WO2009054981 A1 | | 4/2009 |

OTHER PUBLICATIONS

Popov et al. "Apodization of volume holograms by diffusion of organic molecules in a polymer", Opt. Spectrosc. vol. 71(3) pp. 295-296 (Sep. 1991).*

Blanche et al., "Polarization holography reveals the nature of the grating in polymers containing azo-dye", Opt. Commun. vol. 185 pp. 1-12 (2000).*

Hanneberg et al. "2D and 3D buried gratings form azobenzene-polymer multilayer films" Proc. SPIE, vol. 6343 pp. 634337-1 to 634337-9 (2006).*

Morales et al. "synthesis of a photoresponsive polymer and its incorporation into an organic superlattice", Sandia Report SAND2005-0144, 24 pages (Jan. 2005).*

Tangirala et al., "Photopatternable reflective films produced by Nanolayer extrusion", Adv. Func. Mater., vol. 14(6) pp. 595-604 (Jun. 2002).*

International Search Report Including Transmittal for International Application No. PCT/US2012/020393 filed Jan. 6, 2012, mailed Apr. 19, 2012, 4 pages.

Written Opinion of the International Searching Authority for International Application No. PCT/US2012/020393 filed Jan. 6, 2012, mailed Apr. 19, 2012, 4 pages.

International Search Report including Transmittal for International Application No. PCT/US2012/067156 mailed Feb. 7, 2013, 4 pages.

Written Opinion for International Application No. PCT/US2012/067156 mailed Feb. 7, 2013, 5 pages.

U.S. Appl. No. 13/350,149, filed Jan. 13, 2012 entitled "Holographic Recording Medium and Method of Making Holographic Recording Medium".

* cited by examiner

METHOD OF MAKING HOLOGRAPHIC RECORDING MATERIALS AND ARTICLES FORMED THEREBY

BACKGROUND

The present disclosure relates to molded articles that incorporate holograms, more particularly color transmission and reflection holograms. Methods of making and using the same are also disclosed.

Holograms are an increasingly popular mechanism for the authentication of genuine articles, whether it is for security purposes or for brand protection. The use of holograms for these purposes is driven primarily by the relative difficulty with which they can be duplicated. Holograms are created by interfering two coherent beams of light to create an interference pattern and storing that pattern in a holographic recording medium. Information or imagery can be stored in a hologram by imparting the data or image to one of the two coherent beams prior to their interference. The hologram can be read out by illuminating it with beams matching either of the two original beams used to create the hologram and any data or images stored in the hologram will be displayed. As a result of the complex methods required to record holograms, their use for authentication can be seen on articles such as credit cards, software, passports, clothing, and the like.

Two categories of holograms include surface relief structure holograms and volume holograms. Many of the holograms used in security or authentication applications are of the surface relief type, in which the pattern and any data or image contained therein is stored in the structure or deformations imparted to the surface of the recording medium. As a result, the first recorded hologram may be created by the interference of two coherent beams, but duplicates can be created by copying the surface structure using techniques such as embossing. The duplication of holograms is convenient for the mass production of articles such as credit cards or security labels, but it also has the disadvantage that it makes the unauthorized duplication and/or modification of these holograms for use in counterfeit parts possible from the originals using the same mechanism.

Unlike surface holograms, volume holograms are formed in the bulk of a recording medium. Volume holograms have the ability to be multiplexed, storing information at different depths, spatial locations and angles within the bulk recording material and thus have the ability to store greater amount of information, including for example the ability to animate images recorded via spatial, angular or combined angular and spatial multiplexing. In addition, because the holographic pattern is embedded in the material, copying cannot be done using the same techniques as for surface relief holograms, and is in general more difficult to do with high fidelity.

While volume holograms can provide more security against counterfeit duplication than surface relief structure holograms, it would be desirable to increase the security of volume holograms. Increasing the complexity of a volume hologram incorporated into the structure of a product could result in a hologram that would serve as a powerful authenticity tool. Photopolymers have been widely used for volume hologram applications. These photopolymers undergo refractive index changes after optically-induced polymerization following exposure by object and reference light sources. However, photopolymers generally cannot withstand the temperatures and pressures commonly experienced during fabrication processes like co-extrusion or thermal fusion lamination.

Thus, there remains a need for improved holograms for incorporation into the structure of a product such as for security applications.

SUMMARY

In an exemplary embodiment, a method of manufacturing an article for display of a holographic image comprises thermally fusing a holographic recording medium comprising a photochemically active dye dispersed in a transparent thermoplastic polymer binder to another layer or material; and then exposing the holographic film to intersecting beams of coherent light to form a holographic image therein formed by photoreacted areas of the photochemically active dye and unreacted areas of the photochemically active dye.

In another exemplary embodiment, the above-described method may be applied to articles of various arrangements or configurations that include holographic recording media. Such methods may include:

thermally fusing a first holographic recording medium having a plurality of surfaces including a first viewing surface and a second surface, comprising a photochemically active dye dispersed in a transparent polymeric binder and capable of recording a holographic grating therein formed by photoreacted areas of the photochemically active dye and unreacted areas of the photochemically active dye with a second holographic recording medium having a composition that is the same as or different than the composition of the first holographic recording medium and having a plurality of surfaces including a third viewing surface and a fourth surface, comprising a photochemically active dye dispersed in a transparent polymeric binder and capable of recording a holographic grating therein formed by photoreacted areas of the photochemically active dye and unreacted areas of the photochemically active dye;

wherein the second holographic recording medium has a thickness between the third and fourth surfaces that is the same as or different than a thickness between the first and second surfaces of the first holographic recording medium, or wherein the third surface has a surface area that is the same as or different than the surface area of the first surface.

In another exemplary embodiment, an article for the display of a holographic image comprises a volume holographic image as a security, display, and/or aesthetic feature that is made by the above-described method.

In another exemplary embodiment, an article for the display of a holographic image comprises a holographic recording medium having a plurality of surfaces including a first surface and a second surface and is prepared as described above. The holographic recording medium comprises a transparent polymeric binder and a photochemically active dye, and has a transmission holographic image recorded therein formed by exposed and unexposed areas of the photochemically active dye and unexposed areas of the photochemically active dye. A reflective layer or material is disposed over the second surface such that light directed onto the first surface reflects off of the reflecting layer or material and generates a holographic image viewable from the first surface.

BRIEF DESCRIPTION OF THE DRAWINGS

Referring now to the Figures, which represent exemplary embodiments and wherein like elements may be numbered alike.

DETAILED DESCRIPTION

Figure 1:
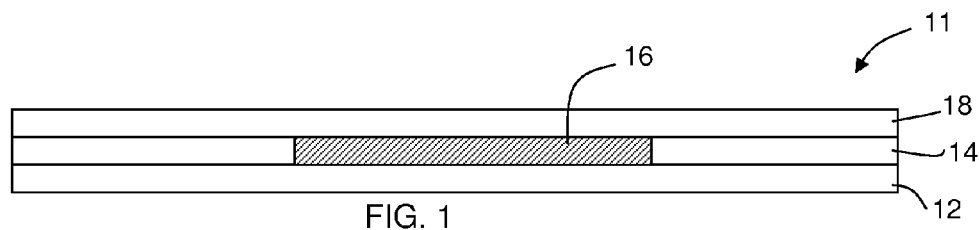
FIG. 1 represents an exemplary structure of an article for recording and displaying a holographic image.

The holographic recording medium disclosed herein comprises a transparent polymeric binder and a photochemically active dye. The polymeric binder may be a thermoplastic polymer, thermosetting polymer, or a combination comprising one or more of such polymers. The polymers can be oligomers, polymers, dendrimers, ionomers, copolymers such as, for example, homopolymers, block copolymers, random copolymers, graft copolymers, star block copolymers; or the like, or a combination comprising at least one of the foregoing polymers. Exemplary thermoplastic organic polymers that can be used in the binder composition include, without limitation, polyacrylates, polymethacrylates, polyesters (e.g., cycloaliphatic polyesters, resorcinol arylate polyester, and so forth), polyolefins, polycarbonates, polystyrenes, polyesters, polyamideimides, polyarylates, polyarylsulfones, polyethersulfones, polyphenylene sulfides, polysulfones, polyimides, polyetherimides, polyetherketones, polyether etherketones, polyether ketone ketones, polysiloxanes, polyurethanes, polyethers, polyether amides, polyether esters, or the like, or a combination comprising at least one of the foregoing thermoplastic polymers, such as polycarbonate and polyester.

Exemplary polymeric binders are described herein as "transparent". Of course, this does not mean that the polymeric binder does not absorb any light of any wavelength. Exemplary polymeric binders need only be reasonably transparent in wavelengths for exposure and viewing of a holographic image so as to not unduly interfere with the formation and viewing of the image. In an exemplary embodiment, the polymer binder has an absorbance in the relevant wavelength ranges of less than 0.2. In another exemplary embodiment, the polymer binder has an absorbance in the relevant wavelength ranges of less than 0.1. In yet another exemplary embodiment, the polymer binder has an absorbance in the relevant wavelength ranges of less than 0.01. Organic polymers that are not transparent to electromagnetic radiation can also be used in the binder composition if they can be modified to become transparent. For examples, polyolefins are not normally optically transparent because of the presence of large crystallites and/or spherulites. However, by copolymerizing polyolefins, they can be segregated into nanometer-sized domains that cause the copolymer to be optically transparent.

In one embodiment, the organic polymer and photochromic dye can be chemically attached. The photochromic dye can be attached to the backbone of the polymer. In another embodiment, the photochromic dye can be attached to the polymer backbone as a substituent. The chemical attachment can include covalent bonding, ionic bonding, or the like.

Examples of cycloaliphatic polyesters for use in the binder composition are those that are characterized by optical transparency, improved weatherability and low water absorption. It is also generally desirable that the cycloaliphatic polyesters have good melt compatibility with the polycarbonate resins since the polyesters can be mixed with the polycarbonate resins for use in the binder composition. Cycloaliphatic polyesters are generally prepared by reaction of a diol (e.g., straight chain or branched alkane diols, and those containing from 2 to 12 carbon atoms) with a dibasic acid or an acid derivative.

Polyarylates that can be used in the binder composition refers to polyesters of aromatic dicarboxylic acids and bisphenols. Polyarylate copolymers include carbonate linkages in addition to the aryl ester linkages, known as polyester-carbonates. These aryl esters may be used alone or in combination with each other or more particularly in combination with bisphenol polycarbonates. These organic polymers can be prepared, for example, in solution or by melt polymerization from aromatic dicarboxylic acids or their ester forming derivatives and bisphenols and their derivatives.

Blends of organic polymers may also be used as the binder composition for the holographic films. Specifically, organic polymer blends can include polycarbonate (PC)-poly(1,4-cyclohexane-dimethanol-1,4-cyclohexanedicarboxylate) (PCCD), PC-poly(cyclohexanedimethanol-co-ethylene terephthalate) (PETG), PC-polyethylene terephthalate (PET), PC-polybutylene terephthalate (PBT), PC-polymethylmethacrylate (PMMA), PC-PCCD-PETG, resorcinol aryl polyester-PCCD, resorcinol aryl polyester-PETG, PC-resorcinol aryl polyester, resorcinol aryl polyester-polymethylmethacrylate (PMMA), resorcinol aryl polyester-PCCD-PETG, or the like, or a combination comprising at least one of the foregoing.

Binary blends, ternary blends and blends having more than three resins may also be used in the polymeric alloys. When a binary blend or ternary blend is used in the polymeric alloy, one of the polymeric resins in the alloy may comprise about 1 to about 99 weight percent (wt %) based on the total weight of the composition. Within this range, it is generally desirable to have the one of the polymeric resins in an amount greater than or equal to about 20, preferably greater than or equal to about 30 and more preferably greater than or equal to about 40 wt %, based on the total weight of the composition. Also desirable within this range, is an amount of less than or equal to about 90, preferably less than or equal to about 80 and more preferably less than or equal to about 60 wt % based on the total weight of the composition. When ternary blends of blends having more than three polymeric resins are used, the various polymeric resins may be present in any desirable weight ratio.

Exemplary thermosetting polymers that may be used in the binder composition include, without limitation, polysiloxanes, phenolics, polyurethanes, epoxies, polyesters, polyamides, polyacrylates, polymethacrylates, or the like, or a combination comprising at least one of the foregoing thermosetting polymers. In one embodiment, an organic material can be used that is a precursor to a thermosetting polymer.

As noted above, the photoactive material is a photochromic dye. The photochromic dye is one that is capable of being written and read by electromagnetic radiation. In one exemplary embodiment, the photochromic dyes can be written and read using actinic radiation i.e., from about 350 to about 1,100 nanometers. In a more specific embodiment, the wavelengths at which writing and reading are accomplished may be from about 300 nanometers to about 800 nanometers. In one exemplary embodiment, the reading and writing and is accomplished at a wavelength of about 300 to about 600 nanometers. In another exemplary embodiment, the writing and reading are accomplished at a wavelength of about 350 to about 550 nanometers. In one specific exemplary embodiment, a holographic medium is adapted for writing at a wavelength of about 405 nanometers. In such a specific exemplary embodiment, reading may be conducted at a wavelength of about 532 nanometers. Examples of photochromic dyes include diarylethenes and nitrones.

An exemplary diarylethylene compound can be represented by formula (XI):

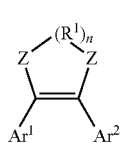

(XI)

wherein n is 0 or 1; $R^1$ is a single covalent bond ($C_0$), $C_1$-$C_3$ alkylene, $C_1$-$C_3$ perfluoroalkylene, oxygen; or —N(CH$_2$)$_x$CN wherein x is 1, 2, or 3; when n is 0, Z is $C_1$-$C_5$ alkyl, $C_1$-$C_5$ perfluoroalkyl, or CN; when n is 1, Z is CH$_2$, CF$_2$, or C=O; $Ar^1$ and $Ar^2$ are each independently i) phenyl, anthracene, phenanthrene, pyridine, pyridazine, 1H-phenalene or naphthyl, substituted with 1-3 substituents wherein the substituents are each independently $C_1$-$C_3$ alkyl, $C_1$-$C_3$ perfluoroalkyl, or fluorine; or ii) represented by following formulas:

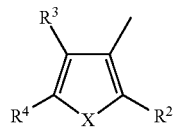

(XII)

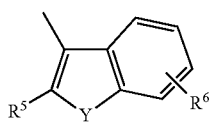

(XIII)

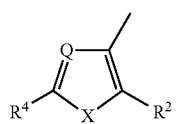

(XIV)

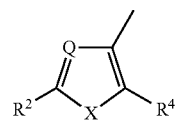

(XV)

wherein $R^2$ and $R^5$ are each independently $C_1$-$C_3$ alkyl or $C_1$-$C_3$ perfluoroalkyl; $R^3$ is $C_1$-$C_3$ alkyl, $C_1$-$C_3$ perfluoroalkyl, hydrogen, or fluorine; $R^4$ and $R^6$ are each independently $C_1$-$C_3$ alkyl, $C_1$-$C_3$ perfluoroalkyl, CN, hydrogen, fluorine, phenyl, pyridyl, isoxazole, —CHC(CN)$_2$, aldehyde, carboxylic acid, —(C$_1$-C$_5$ alkyl)COOH or 2-methylenebenzo[d][1,3]dithiole; wherein X and Y are each independently oxygen, nitrogen, or sulfur, wherein the nitrogen is optionally substituted with $C_1$-$C_3$ alkyl or $C_1$-$C_3$ perfluoroalkyl; and wherein Q is nitrogen.

Examples of diarylethenes that can be used as photoactive materials include diarylperfluorocyclopentenes, diarylmaleic anhydrides, diarylmaleimides, or a combination comprising at least one of the foregoing diarylethenes. The diarylethenes are present as open-ring or closed-ring isomers. In general, the open ring isomers of diarylethenes have absorption bands at shorter wavelengths. Upon irradiation with ultraviolet light, new absorption bands appear at longer wavelengths, which are ascribed to the closed-ring isomers. In general, the absorption spectra of the closed-ring isomers depend on the substituents of the thiophene rings, naphthalene rings or the phenyl rings. The absorption structures of the open-ring isomers depend upon the upper cycloalkene structures. For example, the open-ring isomers of maleic anhydride or maleimide derivatives show spectral shifts to longer wavelengths in comparison with the perfluorocyclopentene derivatives.

Examples of diarylethene closed ring isomers include:

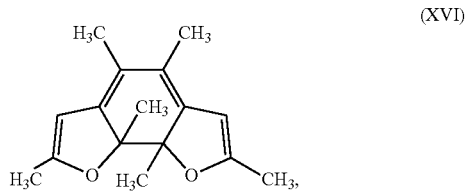

(XVI)

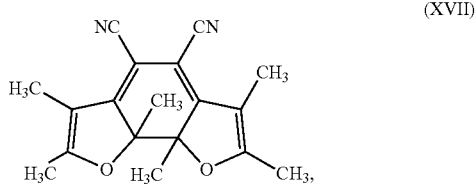

(XVII)

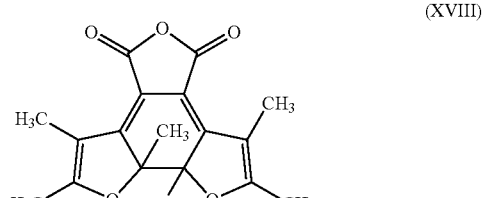

(XVIII)

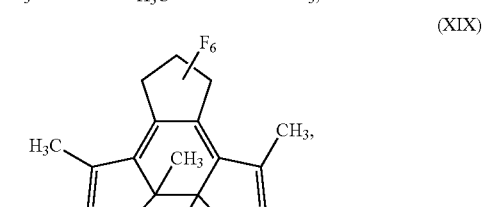

(XIX)

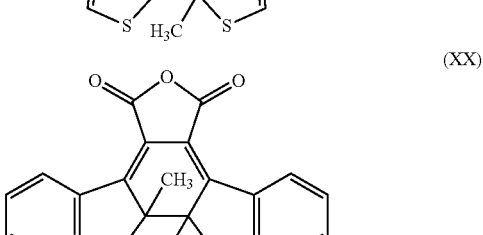

(XX)

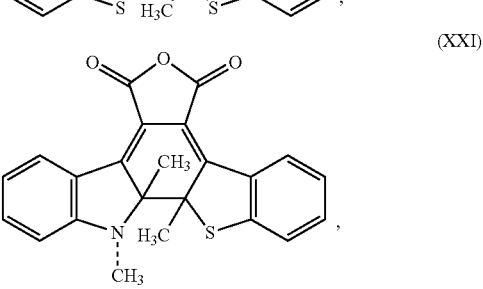

(XXI)

(XXII) 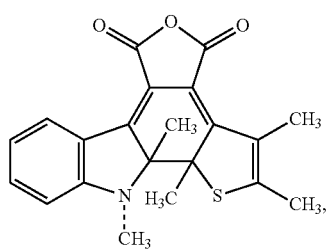
(XXIII) 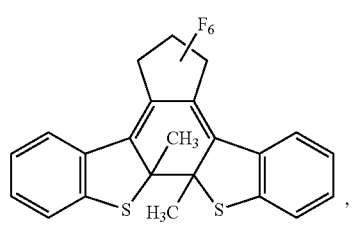
(XXIV) 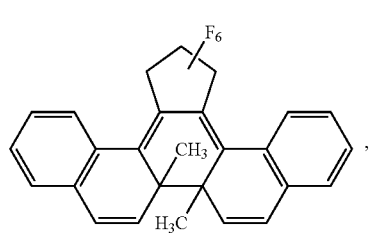
(XXV) 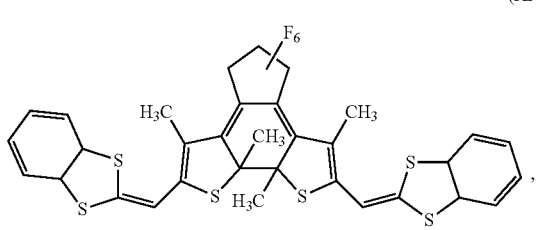
(XXVI) 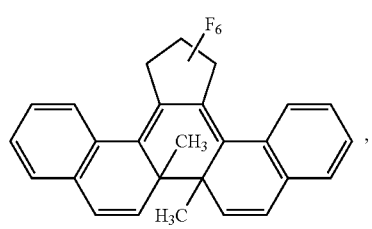
(XXVII) 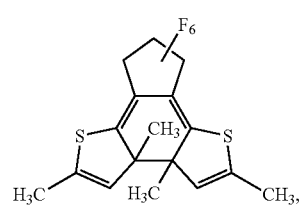
(XXVIII) 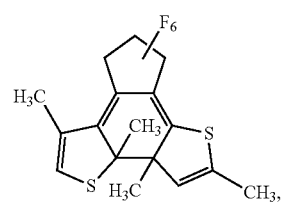
(XXIX) 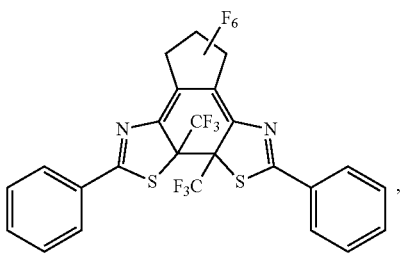
(XXX) 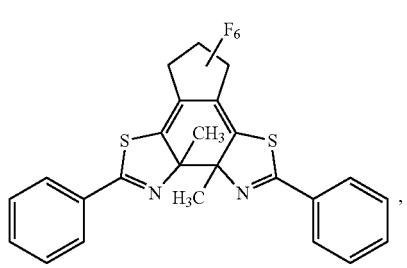
(XXXI) 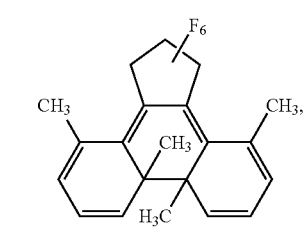
(XXXII) 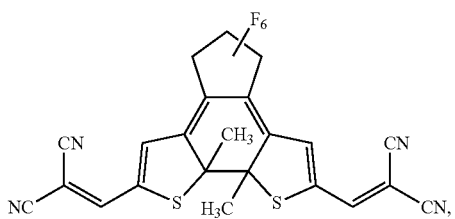
(XXXIII) 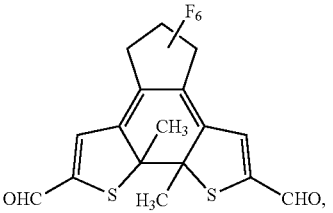
(XXXIV) 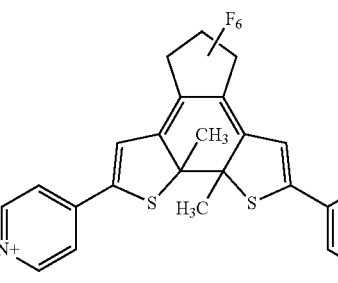

-continued (XXXV)
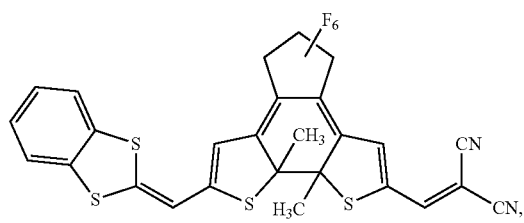

(XXXVI)
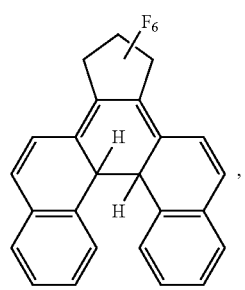

(XXXVII)
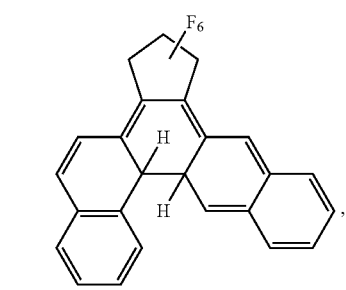

(XXXVIII)
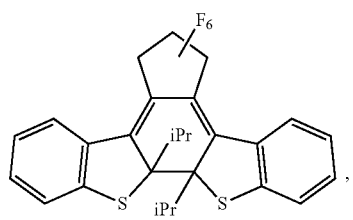

where iPr represents isopropyl;

(XXXIX)
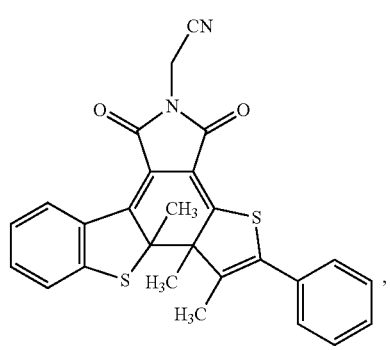

-continued (XXXX)
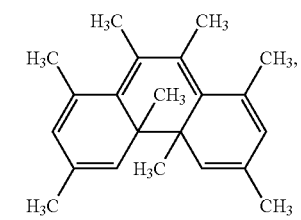

(XXXXI)
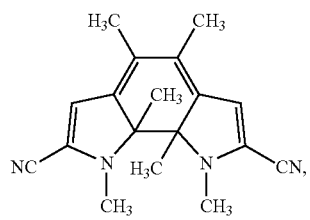

(XXXXII)
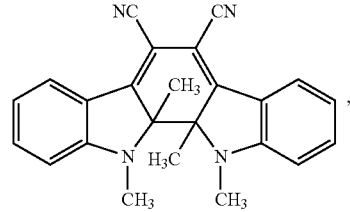

(XXXXIII)
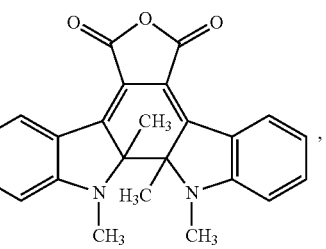

and combinations comprising at least one of the foregoing diarylethenes.

Diarylethenes with five-membered heterocyclic rings have two conformations with the two rings in mirror symmetry (parallel conformation) and in $C_2$ (antiparallel conformation). In general, the population ratio of the two conformations is 1:1. In one embodiment, it is desirable to increase the ratio of the antiparallel conformation to facilitate an increase in the quantum yield, which is further described in detail below. Increasing the population ratio of the antiparallel conformation to the parallel conformation can be accomplished by covalently bonding bulky substituents such as the —($C_1$-$C_5$ alkyl)COOH substituent to diarylethenes having five-membered heterocyclic rings.

In another embodiment, the diarylethenes can be in the form of a polymer having the general formula (XXXXIV) below. The formula (XXXXIV) represents the open isomer form of the polymer.

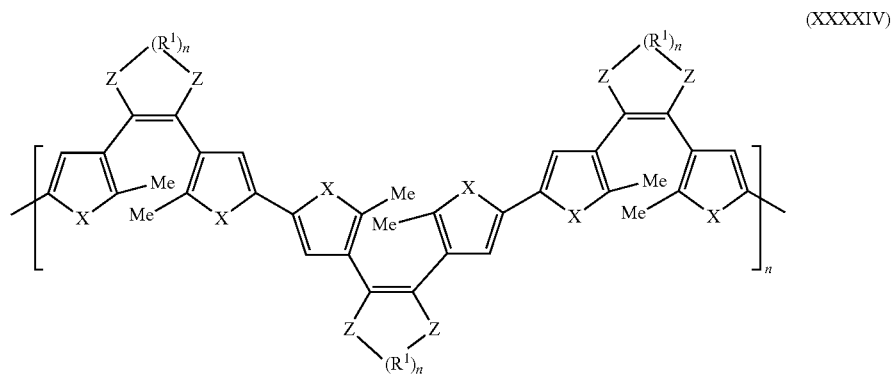

(XXXXIV)

where Me represents methyl, $R^1$, X and Z have the same meanings as explained above in formulas (XI) through (XV) and n is any number greater than 1.

Polymerizing the diarylethenes can also be used to increase the population ratio of the antiparallel conformations to the parallel conformations.

The diarylethenes can be reacted in the presence of light. In one embodiment, an exemplary diarylethene can undergo a reversible cyclization reaction in the presence of light according to the following equation (I):

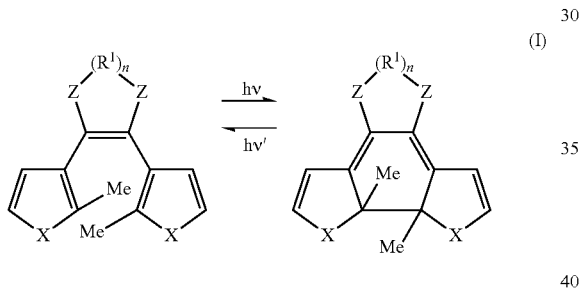

(I)

where X, Z $R^1$ and n have the meanings indicated above; and wherein Me is methyl. The cyclization reaction can be used to produce a hologram. The hologram can be produced by using radiation to react the open isomer form to the closed isomer form or vice-versa.

A similar reaction for an exemplary polymeric form of diarylethene is shown below in the equation (II)

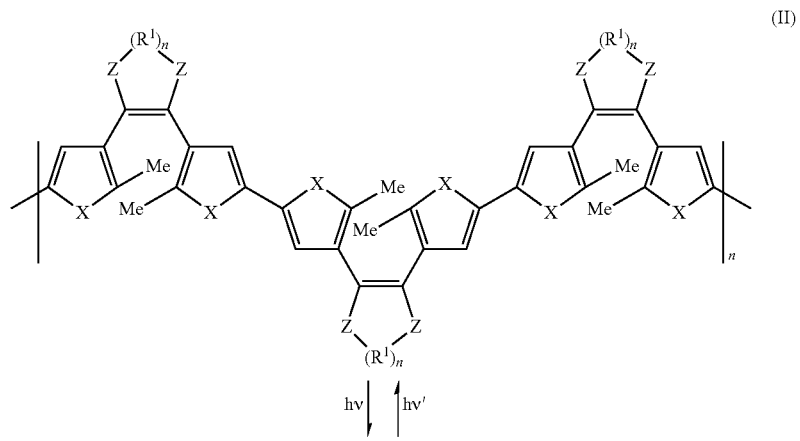

(II)

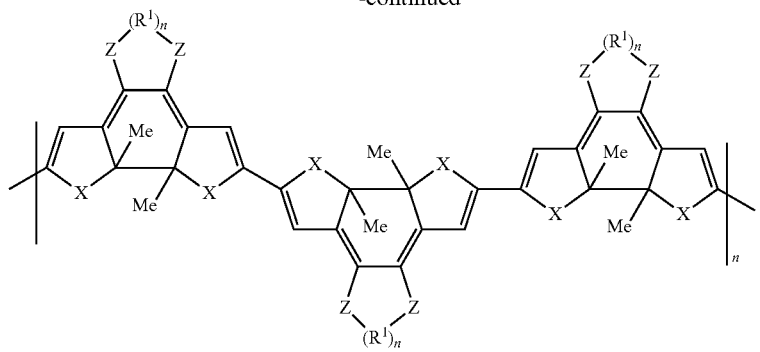

where X, Z $R^1$ and n have the meanings indicated above; and wherein Me is methyl.

As noted above, in yet another embodiment, a diarylethene can undergo a gated reaction in the presence of light. As noted above, diarylethenes with five-membered heterocyclic rings have two conformations with the two rings in mirror symmetry (parallel conformation) and in $C_2$ (antiparallel conformation). Photocyclization can proceed only from the antiparallel conformation. The photocyclization is prohibited when the compound is fixed in the mirror symmetry conformation. As can be seen in the equation (III) below, the formation of intramolecular hydrogen bonding fastens the compound in the parallel conformation thereby making the compound photochemically inactive. Heat can be used to break this intramolecular hydrogen bonding. Diarylethene compounds having special substituents that reversibly fix the conformation undergo gated photochromic reactions, according to the following equation (III):

Equation (III) is termed a gated reaction and can preserve stored data even when readout operations are repeatedly conducted at the same wavelength as the writing operation. Thus by using diarylethenes in which gating is made to occur, the writing and reading can be conducted at the same wavelength.

Nitrones can also be used as photochromic dyes in the holographic storage media. Nitrones have the general structure shown in the formula (XXXXV):

(XXXXV)

An exemplary nitrone generally comprises an aryl nitrone structure represented by the formula (XXXXVI):

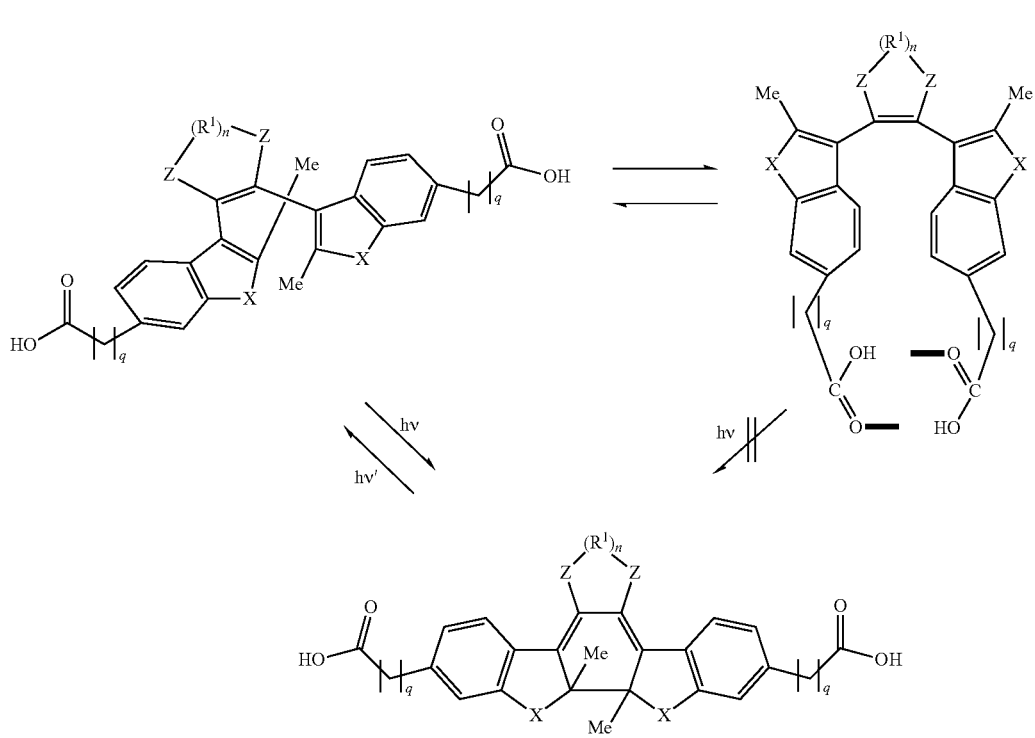

(III)

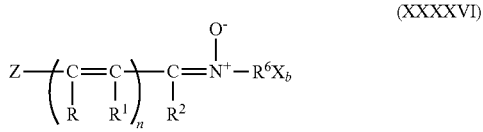

(XXXXVI)

wherein Z is $(R^3)_a$-Q-$R^4$— or $R^5$—; Q is a monovalent, divalent or trivalent substituent or linking group; wherein each of R, $R^1$, $R^2$ and $R^3$ is independently hydrogen, an alkyl or substituted alkyl radical containing 1 to about 8 carbon atoms or an aromatic radical containing 6 to about 13 carbon atoms; $R^4$ is an aromatic radical containing 6 to about 13 carbon atoms; $R^5$ is an aromatic radical containing 6 to about 20 carbon atoms which have substituents that contain hetero atoms, wherein the hetero atoms are at least one of oxygen, nitrogen or sulfur; $R^6$ is an aromatic hydrocarbon radical containing 6 to about 20 carbon atoms; X is a halo, cyano, nitro, aliphatic acyl, alkyl, substituted alkyl having 1 to about 8 carbon atoms, aryl having 6 to about 20 carbon atoms, carbalkoxy, or an electron withdrawing group in the ortho or para position selected from the group consisting of

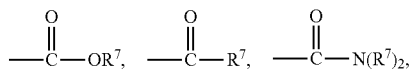

—CN, —$CF_3$, where $R^7$ is a an alkyl radical having 1 to about 8 carbon atoms; a is an amount of up to about 2; b is an amount of up to about 3; and n is up to about 4.

As can be seen from formula (XXXXVI), the nitrones may be α-aryl-N-arylnitrones or conjugated analogs thereof in which the conjugation is between the aryl group and an α-carbon atom. The α-aryl group is frequently substituted, most often by a dialkylamino group in which the alkyl groups contain 1 to about 4 carbon atoms. The $R^2$ is hydrogen and $R^6$ is phenyl. Q can be monovalent, divalent or trivalent according as the value of "a" is 0, 1 or 2. Illustrative Q values are shown in the Table 1 below.

TABLE 1

| Valency of Q | Identity of Q |
| --- | --- |
| Monovalent | fluorine, chlorine, bromine, iodine, alkyl, aryl; |
| Divalent | oxygen, sulphur, carbonyl, alkylene, arylene. |
| Trivalent | nitrogen |

It is desirable for Q to be fluorine, chlorine, bromine, iodine, oxygen, sulfur or nitrogen.

Examples of nitrones are α-(4-diethylaminophenyl)-N-phenylnitrone; α-(4-diethylaminophenyl)-N-(4-chlorophenyl)-nitrone, α-(4-diethylaminophenyl)-N-(3,4-dichlorophenyl)-nitrone, α-(4-diethylaminophenyl)-N-(4-carbethoxyphenyl)-nitrone, α-(4-diethylaminophenyl)-N-(4-acetylphenyl)-nitrone, α-(4-dimethylaminophenyl)-N-(4-cyanophenyl)-nitrone, α-(4-methoxyphenyl)-N-(4-cyanophenyl)nitrone, α-(9-julolidinyl)-N-phenylnitrone, α-(9-julolidinyl)-N-(4-chlorophenyl)nitrone, α-[2-(1,1-diphenylethenyl)]-N-phenylnitrone, α-[2-(1-phenylpropenyl)]-N-phenylnitrone, or the like, or a combination comprising at least one of the foregoing nitrones. Aryl nitrones are particularly useful in the compositions and articles disclosed herein. An exemplary aryl nitrone is α-(4-diethylaminophenyl)-N-phenylnitrone.

Upon exposure to electromagnetic radiation, nitrones undergo unimolecular cyclization to an oxaziridine as shown in the structure (XXXXVII)

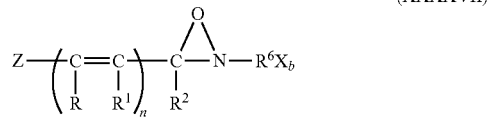

(XXXXVII)

wherein R, $R^1$, $R^2$, $R^6$, n, $X_b$ and Z have the same meaning as denoted above for the structure (XXXXVI).

In addition to the binder and the photochemically active dye, the holographic recording medium may include any of a number of additional components, including but not limited to heat stabilizers, antioxidants, light stabilizers, plasticizers, antistatic agents, mold release agents, additional resins, binders, and the like, as well as combinations of any of the foregoing components.

In one exemplary embodiment, the holographic recording medium is extruded as a relatively thin layer or film, e.g., having a thickness of 1 micron to 2000 microns. In another exemplary embodiment, a layer or film of the holographic recording medium is coated onto, co-extruded with, or laminated with a support. The support may be a planar support such as a film or card, or it may be virtually any other shape as well. In yet another exemplary embodiment, the holographic medium may be molded or extruded into virtually any shape capable of being fabricated by plastic manufacturing technologies such as solvent-casting, film extrusion, biaxial stretching, injection molding and other techniques known to those skilled in the art. Still other shapes may be fabricated by post-molding or post-extrusion treatments such as cutting, grinding, polishing, and the like.

Unlike the photopolymers widely used for holographic imaging, the holographic recording media described herein based on photochemically active dye chemistry can tolerate the typical times and temperatures associated with useful thermoplastic fabrication techniques such as extrusion, co-extrusion or thermal fusion lamination. Such fabrication techniques are advantageously employed with thermoplastic polymer/dye formulations having a glass transition temperature, $T_g$, of greater than or equal to about 85° C. In an exemplary embodiment, a holographic recording medium comprising a transparent polymeric binder and a photochemically active dye is thermally fused with another layer or material at a temperature of at least 190° C. for at least 10 seconds for extrusion and at least 135° C. for approximately 30 minutes for thermal fusion lamination.

Figure 2:
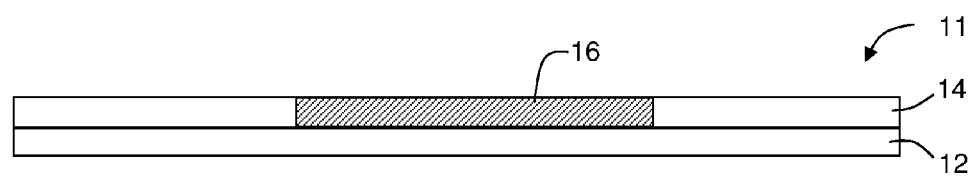
FIG. 2 represents an exemplary structure of an article for recording and displaying a holographic image.

A number of unique novel structures having integrated holographic images are achievable utilizing holographic recording media comprising a transparent polymeric binder and a photochemically active dye. These structures are exemplified in the Figures as having multi-layered film-like or card-like structures shown in cross-section, but it should be understood that structures having various other shapes could be utilized as well. Also, techniques described for fabricating a layer or configuration in one Figure may be used to fabricate like layers or configurations in other Figures. In an exemplary embodiment as shown in FIG. 1, an article 11 comprises a support layer 12 having thereon a layer of holographic recording medium 14 and a top-coat layer 18. A holographic image 16 is shown recorded in the holographic recording medium 14. The support layer 12 should be transparent if the holographic image 16 is a transmission hologram, or it may be transparent or opaque if the holographic image 16 is a reflection hologram. The top-coat layer 18 should be transparent. Either or both of the support layer 12 and the top-coat layer 18 may include one or more light-blocking moieties to help stabilize the holographic image 16. FIG. 2 shows an asymmetric article, similar to that shown in FIG. 1, but without the top-coat layer 18.

Figure 3:
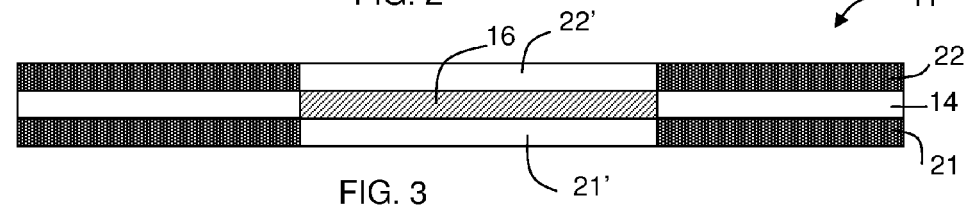
FIG. 3 represents an exemplary structure of an article for recording a holographic image.

Turning now to FIG. 3, a windowed opaque article is shown having a layer of holographic recording medium 14 having holographic image 16. The layer of holographic recording medium 14 is sandwiched between opaque layers 21 and 22, having transparent window areas 21' and 22' therein in the area of holographic image 16. The transparent window areas 21' and 22' may be formed by any of a number of known techniques, such as temporarily interrupting an injection of an opacifying dye or pigment into an extrusion flow being used to form the opaque layers 21 and 22, or by masking the layers in the window areas 21' and 22' while applying an opacifying dye, pigment or coating after the layers are formed. In another exemplary embodiment, an opacifying dye or pigment in the opaque layers 21 and 22 may be bleached in the window areas 21' and 22', such as by actinic radiation or with a chemical bleaching agent.

Figure 4:
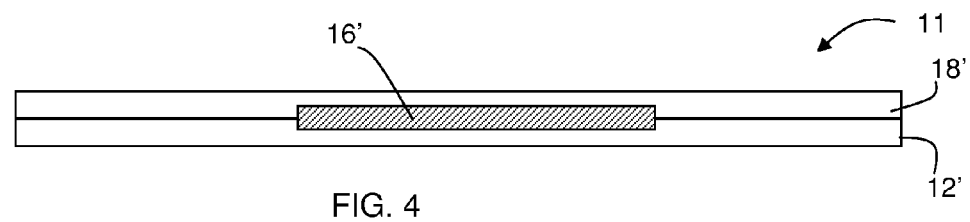
FIG. 4 represents an exemplary structure of an article for recording and displaying a holographic image.

Turning now to FIG. 4, there is shown an article 11 having a holographic recording medium insert 16', which may record a transmission or reflection hologram, sandwiched between transparent layers 12' and 18', which are analogous to layers 12 and 18 from FIG. 1. In an exemplary embodiment, the article shown in FIG. 4 may be fabricated by laminating the insert 16' between the layers 12' and 18'.

Figure 5:
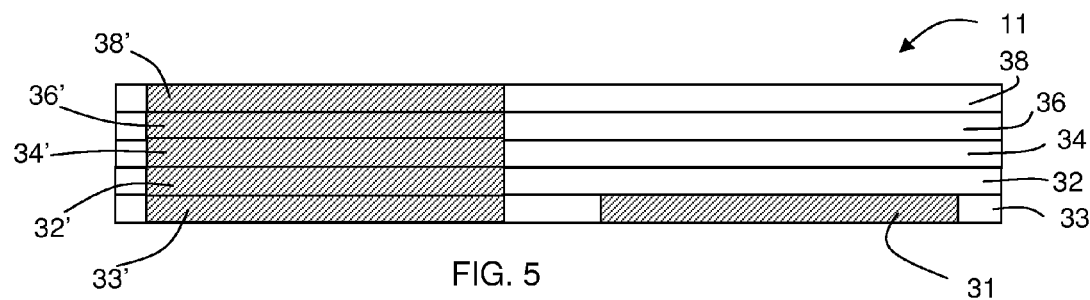
FIG. 5 represents an exemplary structure of an article for recording and displaying a holographic image.

FIG. 5 depicts a hybrid holographic article 11 capable of recording both overt and covert holographic images. Layer 33 has regions of holographic recording media in regions 33' and 31, while layers 32, 34, 36, and 38 have singular regions of holographic recording media in regions 32', 34', 36', and 38', respectively, disposed over region 33'. Regions 33', 32', 34', 36', and 38' together form a thick region of holographic recording medium (e.g., having a combined thickness of greater than or equal to about 150 microns). The thickness of this holographic recording medium reduces the range of angles over which the reference beam can reconstruct the holographic image, thereby significantly limiting the hologram visibility, resulting in a covert holographic image that is not readily seen by a casual observation. Region 31, on the other hand is relatively thin compared to the covert holographic recording region, and an overt holographic image that is more readily observable.

Figure 6:
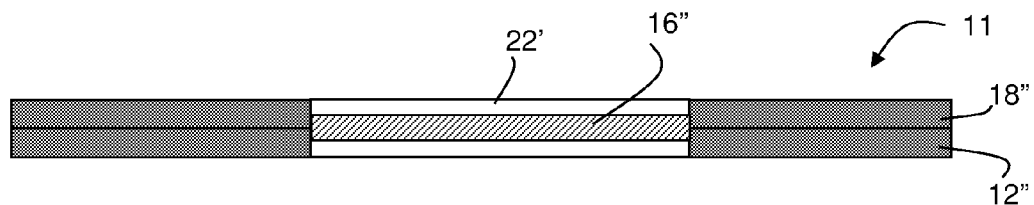
FIG. 6 represents an exemplary structure of an article for recording and displaying a holographic image.

Turning now to FIG. 6, there is shown an article 11 having a reflective holographic recording medium insert 16" sandwiched between opaque layers 21" and 22", which have transparent window regions 21' and 22' therein. Opaque layers 21" and 22" are analogous to layers 21 and 22 from FIG. 3. In an exemplary embodiment, the article shown in FIG. 6 may be fabricated by laminating the insert 16" between the layers 21 and 22.

Figure 7:
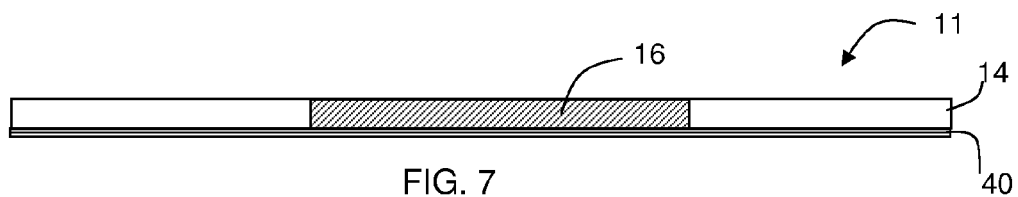
FIG. 7 represents an exemplary structure of an article for recording a transmission holographic image that can be displayed as a reflection hologram.
Figure 8:
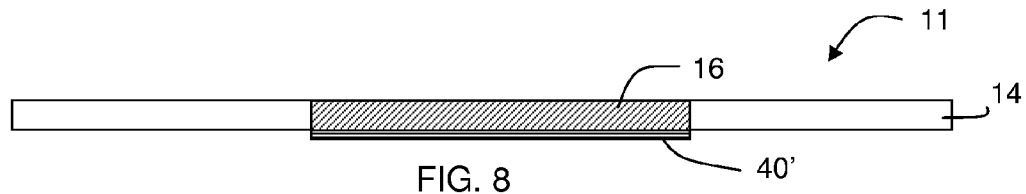
FIG. 8 represents an exemplary structure of an article for recording a transmission holographic image that can be displayed as a reflection hologram.
Figure 9:
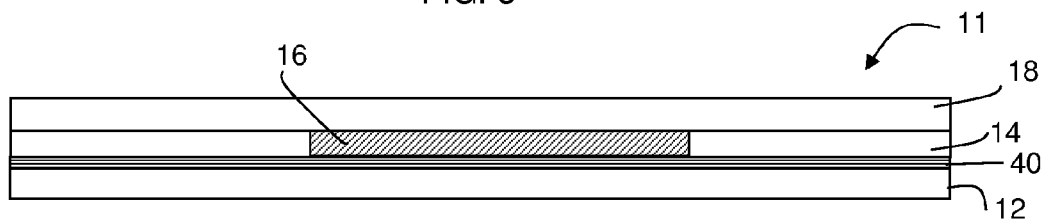
FIG. 9 represents an exemplary structure of an article for recording a transmission holographic image that can be displayed as a reflection hologram.
Figure 10:
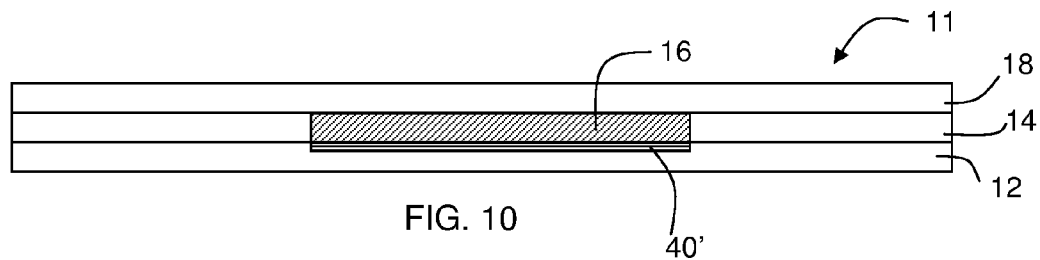
FIG. 10 represents an exemplary structure of an article for recording a transmission holographic image that can be displayed as a reflection hologram.
Figure 11:
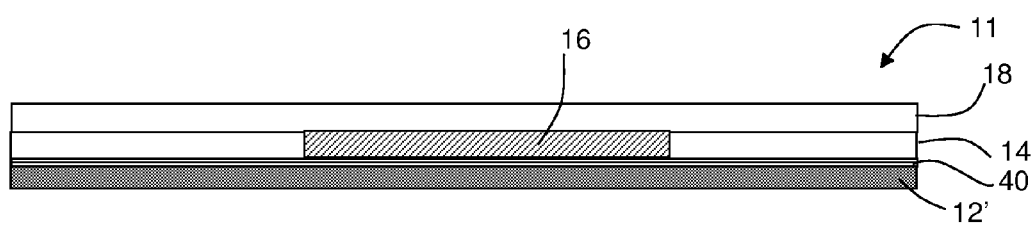
FIG. 11 represents an exemplary structure of an article for recording a transmission holographic image that can be displayed as a reflection hologram.

FIG. 7 depicts an article 11 configured for viewing of a transmission hologram that appears as a reflection hologram. A transparent layer of holographic recording medium 14 has a holographic image 16 recorded therein. Reflective layer 40 is disposed beneath holographic recording medium layer 14. In an exemplary embodiment, the reflective layer 40 is formed by known techniques such as vapor deposition of a thin metal layer, although other techniques may be used such as application of a coating composition containing reflective pigments. Viewing light enters the article from above layer 14, passes through the holographic image 16, and reflects off of the reflective layer 40, passes back through layer 14, and exits the article to be viewed from a position above layer 14. FIG. 8 depicts an article 11 analogous to the article shown in FIG. 7, except that reflective segment 40' disposed below holographic image 16 is used instead of reflective layer 40. This allows for incorporation of a transmission hologram that can be viewed as a reflection hologram, but with a different (non-reflective) viewing image surrounding the hologram. FIG. 9 depicts an article 11 analogous to the article shown in FIG. 1, but with a reflective layer 40 disposed below the holographic recording medium layer 14 so that a transmission hologram 16 recorded in the recording layer 14 can be viewed as a reflection hologram. FIG. 11 depicts an article 11 analogous to the article shown in FIG. 9, but with a reflective segment 40' disposed below holographic image 16 instead of reflective layer 40.

Figure 12:
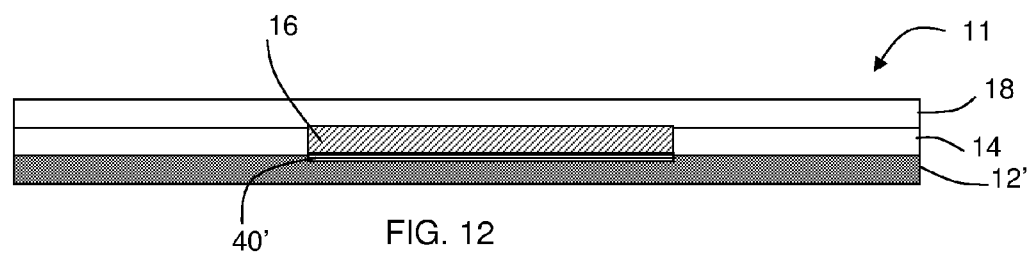
FIG. 12 represents an exemplary structure of an article for recording a transmission holographic image that can be displayed as a reflection hologram.

Turning now to FIG. 11, an article 11 comprises an opaque support layer 12' having thereon a layer of holographic recording medium 14 and a top-coat layer 18. A transmission holographic image 16 is shown recorded in the holographic recording medium 14. The top-coat layer 18 should be transparent, and may also include one or more light-blocking moieties to help stabilize the holographic image 16. Reflective layer 40 is disposed beneath holographic recording medium layer 14. Viewing light enters the article from above layer 14, passes through the holographic image 16, and reflects off of the reflective layer 40, passes back through layer 14, and exits the article to be viewed from a position above layer 14. FIG. 12 depicts an article 11 analogous to the article shown in FIG. 11, except that reflective segment 40' disposed below holographic image 16 is used instead of reflective layer 40. This allows for incorporation of a transmission hologram that can be viewed as a reflection hologram, but with a different (non-reflective) viewing image surrounding the hologram.

Figure 13:
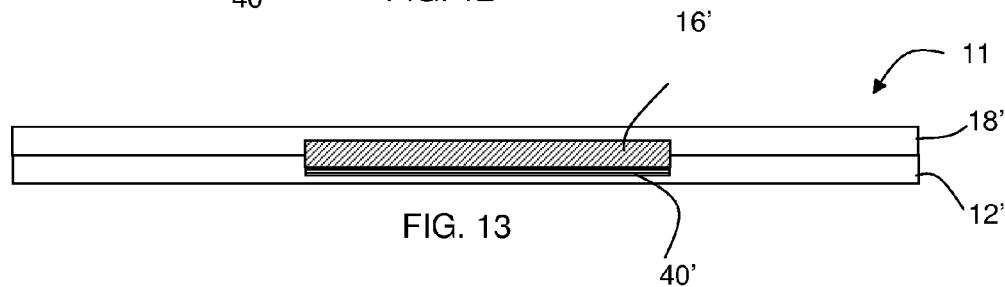
FIG. 13 represents an exemplary structure of an article for recording a transmission holographic image that can be displayed as a reflection hologram.

Turning now to FIG. 13, there is shown an article 11 having a holographic recording medium insert 16' for recording a transmission, sandwiched between transparent layers 12' and 18', which are analogous to layers 12 and 18 from FIG. 1. A reflective segment 40' is disposed underneath the holographic recording medium insert 16' to reflect viewing light from above so that the transmission hologram 16' can be viewed as a reflecting hologram. In an exemplary embodiment, the article shown in FIG. 4 may be fabricated by laminating the insert 16' between the layers 12' and 18'.

Figure 14:
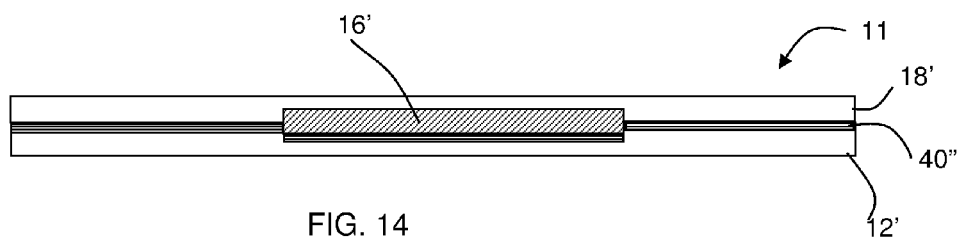
FIG. 14 represents an exemplary structure of an article for recording a transmission holographic image that can be displayed as a reflection hologram.

Turning now to FIG. 14, there is shown an article 11 having a transmission holographic recording medium insert 16' sandwiched between transparent layers 18' and 12'. A reflecting layer 40" is disposed above layer 12', extending across the lower surface of holographic recording medium insert 16'. In an exemplary embodiment, the article shown in FIG. 6 may be fabricated by laminating the insert 16" between an upper element of layer 18' and lower element having of layer 40" on top of layer 12'.

Figure 15:
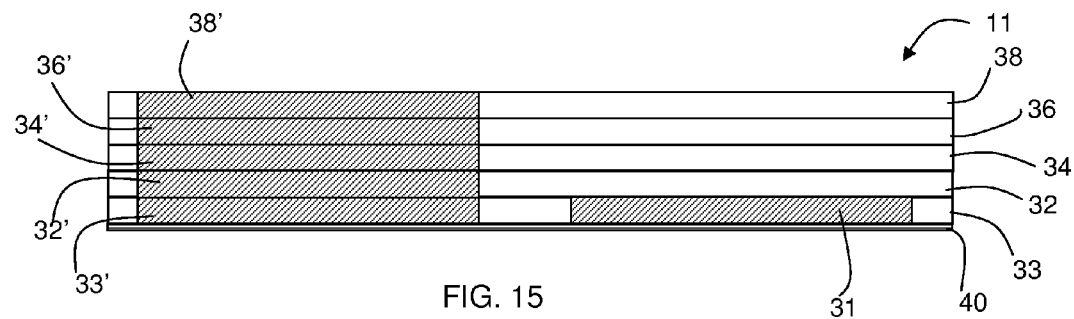
FIG. 15 represents an exemplary structure of an article for recording a transmission holographic image that can be displayed as a reflection hologram.

FIG. 15 depicts a hybrid holographic article 11 capable of recording both overt and covert transmission holographic images that are viewable as reflection holograms. Layer 33 has regions of holographic recording media in regions 33' and 31, while layers 32, 34, 36, and 38 have singular regions of holographic recording media in regions 32', 34', 36', and 38', respectively, disposed over region 33'. Regions 33', 32', 34', 36', and 38' together form a thick region of holographic recording medium (e.g., having a combined thickness of greater than or equal to about 150 microns). The thickness of this holographic recording medium reduces the size of the location where the reference and object light beams can intersect in interfering fashion to form a holographic image, resulting in a covert holographic image that is not readily seen by a casual observation. Region 31, on the other hand is relatively thin compared to the covert holographic recording region, and an overt holographic image that is readily observable. Reflective layer 40 is disposed below the holographic recording medium layers so that transmission hologram 1 recorded in the article can be viewed as reflection holograms.

Figure 16:
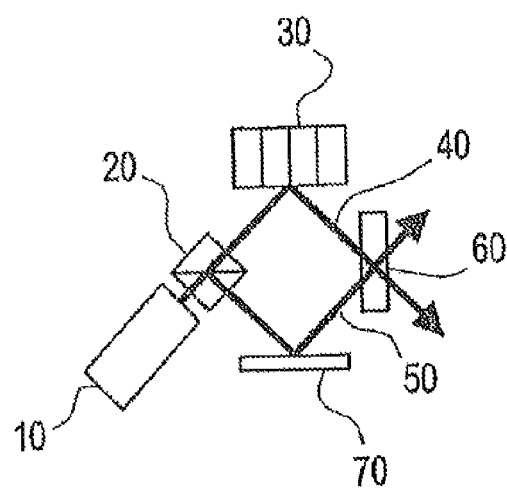
FIG. 16 represents a simplified diagram of an apparatus for recording a transmission hologram.

The holographic image may be recorded in the holographic medium by any of a number of exposure set-ups. Transmission holograms may be recorded by directing the object light source and the reference light source onto the same surface of the holographic recording medium. A simplified diagram of an exemplary embodiment of an apparatus for recording a transmission hologram is shown in FIG. 16. In this configuration, the output from a laser 10 is divided into two equal beams by beam splitter 20. One beam, the signal beam 40, is incident on a form of spatial light modulator (SLM), deformable mirror device (DMD), or object to be recorded 30, which imposes the data to be stored in signal beam 40. An SLM or DMD device may be composed of a number of pixels that can block or transmit the light based upon input electrical signals. Each pixel can represent a bit or a part of a bit (a single bit can consume more than one pixel of the SLM or DMD 30) of data to be stored. The output of SLM/DMD/object 30 is then incident on the storage medium 60. The second beam, the reference beam 50, is transmitted all the way to storage medium 60 by reflection off first mirror 70 with minimal distortion. The two beams are coincident on the same area of storage medium 60 at different angles. The net result is that the two beams create an interference pattern at their intersection in the storage medium 60. The interference pattern is a unique function of the data imparted to signal beam 40 by SLM/DMD/object 30. Reflection holograms may be recorded using an apparatus similar to that shown in FIG. 16, but with the light source paths modified to direct the object light source and the reference light source onto different surfaces of the recording medium, such as opposite sides of a holographic recording film.

While the invention has been described with reference to exemplary embodiments, it will be understood by those skilled in the art that various changes can be made and equivalents can be substituted for elements thereof without departing from the scope of the invention. In addition, many modifications can be made to adapt a particular situation or material to the teachings of the invention without departing from the essential scope thereof. Therefore, it is intended that the invention not be limited to the particular embodiment disclosed as the best mode contemplated for carrying out this invention.

The invention claimed is:

1. A method of manufacturing an article for display of a volume holographic image, comprising:
  co-extruding a layer having a thickness of 1 μm to 2000 μm of a holographic recording medium comprising a photochemically active dye dispersed in and not chemically attached to a transparent thermoplastic polymer binder with a thermoplastic layer to thermally fuse the holographic recording medium with the thermoplastic layer thereby forming said article comprising a holographic recording layer having a thickness of 1 μm to 2000 μm thermally fused to the thermoplastic layer; and then
  exposing the holographic recording layer having a thickness of 1 μm to 2000 μm to intersecting beams of coherent light to form a volume holographic image therein formed by photoreacted areas of the photochemically active dye and unreacted areas of the photochemically active dye.

2. The method of claim 1 wherein the thermal fusion comprises the formation of an interphase at the boundary between the adjacent layers wherein the interphase is composed of a molecular mixture of the polymer chains comprising the adjacent layers to create a monolithic structure which cannot be delaminated without degradation or destruction of the individual layers.

3. The method of claim 1, further comprising:
  thermally fusing the holographic recording medium having a plurality of surfaces including a first viewing surface and a second surface, capable of recording a holographic grating therein formed by photoreacted areas of the photochemically active dye and unreacted areas of the photochemically active dye; with
  a second holographic recording medium having a composition that is the same as or different than the composition of the holographic recording medium and having a plurality of surfaces including a third viewing surface and a fourth surface, comprising a second photochemically active dye dispersed in a transparent polymeric binder and capable of recording a holographic grating therein formed by photoreacted areas of the second photochemically active dye and unreacted areas of the photochemically active dye;
  wherein the second holographic recording medium has a thickness between the third and fourth surfaces that is the same as or different than a thickness between the first and second surfaces of the holographic recording medium, or wherein the third surface has a surface area that is the same as or different than the surface area of the first surface.

4. The method of claim 1, wherein the holographic image is a transmission holographic image.

5. The method of claim 4, wherein the thermoplastic layer is reflective, such that the holographic image is viewable from the same side of the article as an illuminating light source.

6. The method of claim 4, wherein the thermoplastic layer is a contrast-enhancing or otherwise colored layer for enhanced hologram viewability.

7. The method of claim 1, wherein the holographic image is a reflection holographic image.

8. The method of claim 1, wherein the thermoplastic layer is an imaging layer, and further comprising recording a non-holographic image in the imaging layer.

9. The method of claim 8, wherein the non-holographic image is recorded by laser marking.

10. The method of claim 1, wherein the holographic recording medium is co-extruded with said thermoplastic layer and a second thermoplastic layer, the second thermoplastic layer having a composition that is the same as or different than the thermoplastic layer, such that the holographic recording medium is surrounded by the thermoplastic layer and the second thermoplastic layer material.

* * * * *